United States Patent
Zimmermann

(10) Patent No.: US 8,080,125 B2
(45) Date of Patent: Dec. 20, 2011

(54) GAS-PERMEABLE PLASMA ELECTRODE, METHOD FOR PRODUCTION OF THE GAS-PERMEABLE PLASMA ELECTRODE, AND A PARALLEL-PLATE REACTOR

(75) Inventor: Markus Zimmermann, Paris (FR)

(73) Assignee: Infineon Technologies AG, Neubiberg (DE)

( * ) Notice: Subject to any disclaimer, the term of this patent is extended or adjusted under 35 U.S.C. 154(b) by 1121 days.

(21) Appl. No.: 11/157,673

(22) Filed: Jun. 21, 2005

(65) Prior Publication Data
US 2007/0052355 A1    Mar. 8, 2007

(30) Foreign Application Priority Data
Jun. 21, 2004   (DE) .................... 10 2004 029 959

(51) Int. Cl.
*C23F 1/00* (2006.01)
*H01L 21/306* (2006.01)
*C23C 16/00* (2006.01)

(52) U.S. Cl. .......... 156/345.43; 156/345.47; 118/723 E

(58) Field of Classification Search .................. 118/715, 118/722, 723 R, 723 E; 156/345.33, 345.34, 156/345.43, 345.44, 345.45, 345.46, 345.47
See application file for complete search history.

(56) References Cited

U.S. PATENT DOCUMENTS

| | | | | |
|---|---|---|---|---|
| 4,367,114 A | * | 1/1983 | Steinberg et al. | 156/345.34 |
| 5,578,129 A | * | 11/1996 | Moriya | 118/719 |
| 5,595,602 A | * | 1/1997 | Harlan | 118/715 |
| 5,959,409 A | * | 9/1999 | Dornfest et al. | 315/111.21 |
| 6,118,218 A | | 9/2000 | Yializis et al. | |
| 6,451,157 B1 | | 9/2002 | Hubacek | |
| 2004/0110059 A1 | | 6/2004 | Onishi et al. | |

FOREIGN PATENT DOCUMENTS

WO    WO 03/001558 A1    1/2003

* cited by examiner

*Primary Examiner* — Maureen Gramaglia

(57) ABSTRACT

A gas-permeable plasma electrode has an electrically conductive container with a base which has a hole, and a gas-permeable porous electrically conductive film, with the gas-permeable porous electrically conductive film being arranged opposite the base in the electrically conductive container and being connected to the electrically conductive container, and with the gas-permeable porous electrically conductive film having at least one layer of electrically conductive grains, at least some of which are arranged so as to form a gas-permeable film.

12 Claims, 1 Drawing Sheet

GAS-PERMEABLE PLASMA ELECTRODE, METHOD FOR PRODUCTION OF THE GAS-PERMEABLE PLASMA ELECTRODE, AND A PARALLEL-PLATE REACTOR

The invention relates to a gas-permeable plasma electrode, to a method for production of the gas-permeable plasma electrode, and to a parallel-plate reactor.

So-called plasma electrodes are frequently used during the production of integrated circuits. For example, they are used as an electrode in so-called parallel-plate reactors, through which electrode gases are supplied during a plasma chemical vapor deposition process (PCVD process) or during plasma dry etching. In general, gas is introduced into a plasma electrode and is distributed, and is then ionized on leaving the plasma electrode, to form the plasma.

One conventional plasma electrode 300 is illustrated schematically in FIG. 3. The plasma electrode 300 has a radio-frequency shield 301 composed of ceramic, part of which surrounds an electrode head 302, which is in the form of a pot and is composed of a conductive material. The electrode head 302 which is in the form of a pot has a base area and an edge area. The base area of the electrode head 302 has an opening 303 in its central area, through which a gas can enter the plasma electrode 300. A so-called buffer plate 304 is arranged opposite the base area of the electrode head 302 which is in the form of a pot, has two or more openings 305 and is used to distribute the gas entering the plasma electrode 300 through the opening 303 over the entire area of the plasma electrode 300 in order to prevent the formation of a so-called central spot. Furthermore, the plasma electrode 300 has a perforated so-called shower plate 306, which is used to allow the gas passing through the buffer plate 304 to emerge from the plasma electrode 300 as an ionized gas uniformly over the entire area of the shower plate 306. For this purpose, the shower plate 306 has a large number of small openings, through which the gas, or the gas which has been ionized to form a plasma, emerges from the plasma electrode 300. The buffer plate 304 and the shower plate 306 are composed of a conductive material, in general of metal, in the same way as the electrode head 302, and are firmly connected to one another by means of screws 307 in the edge area of the plasma electrode 300. The screws 307 also ensure that the electrode head 302, the buffer plate 304 and the shower plate 306 make electrical contact with one another.

As has already been stated, the plasma electrode 300 is used in PCVD processes or plasma dry etching processes to supply plasma into a process chamber, and its design ensures that the plasma is supplied in a uniformly distributed form. The arrows 308, 309 and 310 in FIG. 3 schematically illustrate the passage of the gas/plasma through the plasma electrode 300. The gas is introduced into the plasma electrode 300 through the central opening 303 in the electrode head 303, as is indicated schematically by the arrow 308. The gas is distributed within a first cavity 311, which is formed by the edge area of the electrode head 302 and of the buffer plate 304, and passes through the openings 305 in the buffer plate 304, as is illustrated schematically by the arrows 309. The shower plate 306, which is located in the path of the gas/plasma through the plasma electrode 300 downstream from the buffer plate 304, distributes the gas/plasma even more uniformly over the entire area of the plasma electrode 300. The buffer plate 304 and the shower plate 306 form a second cavity 312 for this purpose. Furthermore, the shower plate has a large number of openings, through which the ionized gas, that is to say the plasma, emerges from the plasma electrode 300, as is illustrated schematically by the arrows 310 in FIG. 3.

The described design of the plasma electrode 300 ensures that the gas/plasma is distributed uniformly over a larger area. The plasma electrode 300 illustrated schematically in FIG. 3 has the disadvantage, however, that the production process is expensive since, for example, the production of the shower plate with its large number of small openings (which are necessary in order to distribute the gas/plasma as uniformly as possible, for example over a wafer) is rather costly. Another cost factor, by way of example, is the screws, which are made of a special anti-corrosive steel. Furthermore, the use of the screws also leads to the overall plasma electrode having a generally poor, that is to say high, impedance, since the electrical contact between the electrode head, the buffer plate and the shower plate is unsatisfactory.

[1] describes a plasma electrode with a porous film composed of a ceramic material, with the ceramic material having a continuous three-dimensional network structure, with randomly distributed pore sizes. The network structure of the ceramic material is based on the network-like structure of a polyurethane foam, which is used as the base material. The urethane foam is introduced into a solution containing the ceramic material. The ceramic material is hardened during subsequent heating, while the urethane base material burns away.

[2] describes a plasma electrode with a porous metallic film, which is produced by means of a sintering method from metallic powder particles of a defined size. The film has a structure with a high hole density and a homogeneous distribution of the hole sizes, using hole sizes in the sub-micrometer or micrometer range.

[3] discloses a porous film, which comprises a number of film elements composed of titanium powder particles, each having different diameters.

[4] discloses a baffle plate composed of silicon and/or silicon carbide, which is intended to reduce impurities in a semiconductor substrate (for example a silicon wafer) resulting from particles and/or metal, for example during a plasma etching process.

The invention is based on the problem of providing a plasma electrode, a method for production of a plasma electrode, and a parallel-plate reactor, with the plasma electrode being simple to produce and having a better impedance.

The problem is solved by the gas-permeable plasma electrode, the method for production of the gas-permeable plasma electrode and the parallel-plate reactor having the features as claimed in the independent patent claims.

A gas-permeable plasma electrode has an electrically conductive container with a base which has a hole, and a gas-permeable porous electrically conductive film, with the gas-permeable porous electrically conductive film being arranged opposite the base in the electrically conductive container and being connected to the electrically conductive container.

In a method for production of a gas-permeable plasma electrode, a gas-permeable porous electrically conductive film is formed in an electrically conductive container with a base which has a hole, which electrically conductive film is connected to the electrically conductive container. The gas-permeable porous electrically conductive film is preferably formed by the formation of at least one film of electrically conductive grains which are then connected to one another and the electrically conductive container in such a way that the gas-permeable porous electrically conductive film is formed.

A parallel-plate reactor has a pressure chamber with a gas-permeable plasma electrode and a drawing electrode, with the plasma electrode having an electrically conductive container with a base which has a hole, and a gas-permeable porous electrically conductive film, with the gas-permeable porous electrically conductive film being arranged opposite the base in the electrically conductive container and being connected to the electrically conductive container.

One aspect of the invention can clearly be seen in that the use of a gas-permeable porous electrically conductive film makes it possible to provide a plasma electrode which can be produced easily and at low cost, with the plasma emerging homogeneously from the plasma electrode. The gas-permeable porous electrically conductive film according to the invention obviously replaces the buffer plate and the shower plate of the plasma electrode according to the prior art and is used to distribute a gas (which enters the plasma electrode through the opening in the base of the container) uniformly over the entire surface, that is to say the entire extent of the gas-permeable porous electrically conductive film, from which it can emerge as an ionized gas, that is to say as a plasma. In this case, the gas is ionized, that is to say the plasma is formed, when the gas emerges from the plasma electrode. The electrically conductive container may be a container essentially in the form of a trough or pot, and clearly corresponds to the electrode head of the plasma electrode according to the prior art.

Preferred developments of the invention are described in the dependent claims. The further refinements of the invention, which are described in conjunction with the plasma electrode, also apply in the same sense to the method for production of the plasma electrode and to the parallel-plate reactor.

In one development, the gas-permeable porous electrically conductive film has at least one layer of electrically conductive grains, at least some of which are arranged, and are preferably connected to one another, so as to form a gas-permeable film.

As a result of the formation of a gas-permeable porous electrically conductive film on a plasma electrode composed of conductive grains which are connected to one another, the invention provides a plasma electrode which can be produced easily and at low cost, with the plasma emerging from the plasma electrode homogeneously.

The electrically conductive grains are preferably sintered to one another.

The sintering of the electrically conductive grains represents a simple way to produce the gas-permeable porous electrically conductive film composed of electrically conductive grains. In particular, the sintering provides a simple capability by means of which the gas-permeable porous electrically conductive film can be connected to the conductive container without having to use screws, as in the prior art. The gas-permeable porous electrically conductive film is clearly firmly connected to the conductive container by means of sintering, when formed from electrically conductive grains. In comparison to the prior art, there is therefore no need for the screws, which have to be formed from specific material. Furthermore, the firm connection of the gas-permeable porous electrically conductive film to the conductive container reduces the probability of the gas-permeable porous electrically conductive film becoming detached from the conductive container, as occurs in the case of plasma electrodes according to the prior art when the screws become loose over the course of time. Furthermore, the disadvantage of the plasma electrode according to the prior art, that the uniformity of the plasma emerging from the plasma electrode is also reduced as the screws become loose, with the impedance of the plasma electrode being increased at the same time, is also avoided by the gas-permeable porous electrically conductive film and the conductive container being firmly connected to one another.

The firm connection of the gas-permeable porous electrically conductive film and the conductive container to one another also has the advantage that it is possible to prevent energy and particle losses resulting from the striking of an arc discharge which can occur in plasma electrodes according to the prior art if loosening of the screws which attach the buffer plate and/or the shower plate to the electrode head occurs.

The sintering process, that is to say the use of a specific temperature at a specific pressure, makes it possible to ensure that the electrically conductive grains and the conductive container form a cohesive body which has an essentially smooth surface. During the sintering process, it is necessary to take care to ensure that adequate elasticity and adequate gas-permeability are achieved for the gas-permeable porous electrically conductive film. This can be ensured, for example, by the choice of the sintering pressure and/or the temperature during sintering. While carrying out the sintering process, attention must also be paid to the material of the gas-permeable porous electrically conductive film.

The gas-permeable porous electrically conductive film particularly preferably has two or more gas-permeable film elements with electrically conductive grains.

The two or more gas-permeable film elements clearly form a type of porous body, but in which the individual pores are connected to one another so that gases can pass through the porous body. The provision of two or more gas-permeable film elements composed of electrically conductive grains makes it possible to create a mechanically stable, gas-permeable porous electrically conductive film. The gas-permeable porous electrically conductive film composed of two or more gas-permeable film elements clearly forms a plate which, in addition to good electrical conductivity, also has good thermal conductivity, thus reducing bending, that is to say mechanical deformation, of the gas-permeable porous electrically conductive film as a result of different heating. The thermal conductivity and the impedance of the gas-permeable porous electrically conductive film according to the invention are in this case approximately as good as the thermal conductivity and impedance of a solid conductive body. The formation of a porous body is also advantageous because this makes it possible to reduce the probability of a microplasma being struck in comparison to the probability of a microplasma being struck in the cavity between the buffer plate and the shower plate in the plasma electrode according to the prior art. The striking of a microplasma once again leads to energy of particle losses, which are reduced by means of a plasma electrode according to the invention. The prevention of the striking probability in a plasma electrode according to the invention is possible because the individual pores have a very much smaller volume than the individual cavity in the plasma electrode according to the prior art.

The formation of the porous body also reduces the free movement distance of the gas/plasma through the plasma electrode, thus reducing backward diffusion of the gas/plasma into the plasma electrode. The free movement distance is in this case understood to mean the movement distance which a gas/plasma travels without scattering. In plasma electrodes according to the prior art, this corresponds essentially to the extent of the cavities which are formed between the electrode head, the buffer plate and the shower plate. These cavities are considerably larger than the individual pores in the porous body of the plasma electrode according to the invention.

In one development, the electrically conductive grains of each gas-permeable film element have a different diameter.

The diameters of the electrically conductive grains in the individual gas-permeable film elements may decrease from the base of the electrically conductive container.

The provision of film elements which have electrically conductive grains of different diameters, that is to say of different sizes, with the size of the electrically conductive grains decreasing from the base of the conductive container through which the gas enters the plasma electrode towards the opposite side of the gas-permeable film, makes it possible to produce a gradient in the pore size. The pore size is understood to mean the size of the holes which remain when the individual electrically conductive grains are connected to one another, and which ensure the gas-permeability of the individual gas-permeable film elements, and thus of the overall gas-permeable porous electrically conductive film.

In this application, the gradient of the pore size means that the pore size decreases or increases monotonically from one film element to another, that is to say, starting from a first film element, a subsequent film element in the direction of a gas flow always has a larger pore size, which corresponds to a positive gradient or, starting from a first film element, a subsequent film element in the direction of a gas flow always has a smaller pore size, which corresponds to a negative gradient. The negative gradient, that is to say a pore size which becomes increasingly smaller, is particularly preferable since this makes it possible to achieve a stable, uniform gas pressure distribution in the gas-permeable film. According to the invention, the use of electrically conductive grains makes it possible to achieve a small diameter, such that the distribution of the plasma is very homogeneous as it emerges from the plasma electrode.

The electrically conductive grains are preferably essentially spherical.

The use of electrically conductive grains which are essentially spherical makes it possible to form a uniform, that is to say homogeneous, arrangement of holes at the surface of the gas-permeable porous electrically conductive film, through which surface the plasma emerges from the plasma electrode. This leads to a homogeneous plasma supply, for example over a wafer which has been processed in a parallel-plate reactor by means of plasma processes. When using spherical electrically conductive bodies, sintering of the spheres to one another essentially results in holes with a triangular cross section in the gas-permeable porous electrically conductive film.

In one exemplary embodiment, each gas-permeable film element has two or more layers of electrically conductive grains.

The use of two or more layers of electrically conductive grains for each individual gas-permeable film element makes it possible in a simple manner to form a mechanically stable, gas-permeable porous electrically conductive film, that is to say a porous gas-permeable body, which at the same time results in the formation of a gradient of the gas or plasma pressure through the porous body. The use of two or more layers of electrically conductive grains leads to a thicker gas-permeable porous electrically conductive film, thus increasing the thermal conductivity and the electrical conductivity of the gas-permeable porous electrically conductive film. The greater thickness also allows a firmer connection with a lower contact resistance between the gas-permeable porous electrically conductive film and the conductive container.

It is particularly preferable for the electrically conductive grains of the gas-permeable porous electrically conductive film to have graphite and/or aluminum.

Graphite and aluminum are materials which are particularly suitable for the formation of the electrically conductive grains, because they can be provided in a simple manner in granular form, which can also be referred to as a granulate. Furthermore, these materials can be sintered to one another and to the electrically conductive container in a simple manner, with the electrically conductive container preferably being formed from the same material as the electrically conductive grains.

In one development, one surface of the gas-permeable porous electrically conductive film, which faces away from the base of the conductive container, is anodized.

The anodization creates a protective layer which can prevent the creation and detachment of particles from the plasma electrode. For example, aluminum-fluoride particles may be formed during plasma cleaning by means of $C_2F_6$, and these can lead to contamination.

In one exemplary embodiment, the gas-permeable film has at least one gas-permeable intermediate base, which is arranged between two gas-permeable film elements.

The provision of a gas-permeable intermediate base makes it possible in a particularly simple manner to achieve an ideal arrangement of the individual electrically conductive grains, for example if spherical electrically conductive grains are used, that is to say ideal spherical packing. The gas-permeable intermediate base, which may clearly be regarded as a grating, allows the individual gas-permeable film elements to be separated from one another. The material of the intermediate base is preferably the same as the material of the electrically conductive grains.

In summary, one aspect of the invention may be seen in that a plasma electrode, a method for production of the plasma electrode and a parallel-plate reactor are created, in which the buffer plate and the shower plate of a plasma electrode according to the prior art are replaced by a porous gas-permeable body. The porous gas-permeable body is preferably formed by incorporating single-layer or multiple-layer film elements with electrically conductive spheres, for example composed of aluminum or graphite, into an electrically conductive container, which has a central gas hole in its base and has, as its material, for example, aluminum or graphite. In this case, the sphere diameter decreases from one film element to the next, starting from the base of the electrically conductive container.

The sphere diameter of individual film elements may in this case be chosen to be between 10 mm and 1 mm, for example from 10 mm through 7 mm, 4 mm, 3 mm to 1 mm.

The electrically conductive container with the films of electrically conductive spheres arranged in it is then sintered to form a thermally and electrically conductive porous solid body which is, nevertheless, still gas-permeable. The sphere diameters of the last film element, that is to say the film element which is furthest away from the base of the electrically conductive container, or in other words through which film element the plasma which enters as a gas through the central hole in the plasma electrode emerges from the plasma electrode, in this case defines the size of the gas outlet openings from the plasma electrode.

The use of electrically conductive spheres results in gas outlet openings with an approximately triangular cross section and in the surface of the plasma electrode in which the gas outlet openings are located, the so-called electrode surface, being rough with corrugations. However, in general, this does not lead to disadvantages in the use of the plasma electrode for plasma chemical vapor deposition processes (PCVD processes) or plasma etching processes. In certain circumstances, the corrugated roughness can even advantageously influence the striking behavior of the plasma electrode. Alternatively, the electrode surface may be smooth, for example by grinding.

The risk of backward diffusion of plasma into the plasma electrode is negligible provided that the gas supply pressure to the plasma electrode is high in comparison to the pressure in a chamber which the plasma enters after passing through the plasma electrode, for example a vacuum chamber in which a wafer is being subjected to a PCVD process or a plasma etching step. If the material of the granulate, that is to say the material of the electrically conductive grains, is chosen to be the same as the material of the electrically conductive container, it is also possible to reduce the deposition of oxides or nitrides in the plasma electrode, that is to say in the pores of the porous body while, in contrast, in the case of plasma electrodes according to the prior art, oxides and nitrides are deposited on the relatively cold buffer plate. According to the invention, the porous body may also be heated in order to further reduce the risk of deposition. The small pores or cavities in the plasma electrode also reduce the probability of formation of a plasma that assists deposition in the plasma electrode.

Exemplary embodiments of the invention will be explained in more detail in the following text and are illustrated in the figures, in which.

Exemplary embodiments of the invention will be explained in more detail with reference to the figures.

Figure 1:
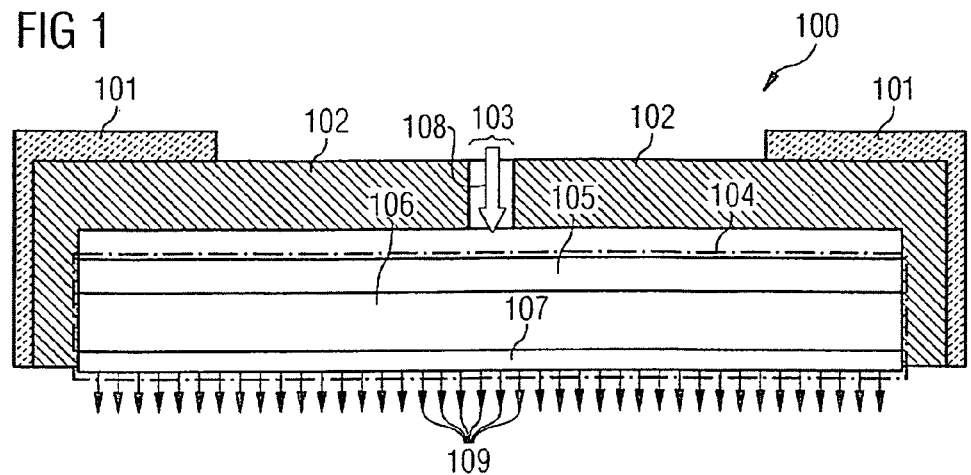
FIG. 1 shows a schematic illustration of a plasma electrode according to one exemplary embodiment of the invention.

FIG. 1 shows, schematically, a plasma electrode 100 according to one exemplary embodiment of the invention. The plasma electrode 100 has a radio-frequency shield 101 composed of ceramic which has a container, or expressed in a clear form, an electrode head 102 in the form of a pot or trough, which is composed of a conductive material, preferably aluminum or graphite. The electrode head 102 has a base area and an edge area. The base area of the electrode head 102 has an opening 103 in its central area, through which gas can enter the plasma electrode 100.

A gas-permeable film 104 is formed opposite the base area of the electrode head 102, is a porous electrically conductive film and is formed from two or more gas-permeable film elements 105, 106 and 107. In FIG. 1, the gas-permeable porous electrically conductive film 104 has three gas-permeable film elements although, according to the invention, the number of gas-permeable film elements may be greater or less than this. The gas-permeable film 104 has spheres which are composed of an electrically conductive material, preferably aluminum or graphite. The spheres in the individual gas-permeable film elements 105, 106 and 107 have a different sphere diameter. The spheres in the first gas-permeable film element 105 have a sphere diameter of 10 mm, the spheres in the second gas-permeable film element 106 have a sphere diameter of 4 mm, and the spheres in the third gas-permeable film element 107 have a sphere diameter of 1 mm.

The individual spheres in the gas-permeable film 104 are sintered using heat and pressure, resulting in a porous body which is gas-permeable and forms the gas-permeable film 104. Furthermore, during the sintering process, a firm connection is formed between the gas-permeable film 104 and the electrode head 102. The formation of the firm connection is assisted by using the same material for the electrode head 102 and for the spheres in the gas-permeable film. The gas-permeable film 104 or the porous body in this case has a decreasing sphere size starting from the base of the electrode head 102, thus resulting in a gradient in the pore size or, in other words, in the size of the intermediate spaces between the spheres in an individual gas-permeable film element.

As already described, the plasma electrode 100 is used to supply a plasma in PCVD processes or plasma dry etching processes and, by virtue of its design, ensures that the plasma is supplied distributed uniformly. In FIG. 1, the arrows 108 and 109 schematically illustrate the gas/plasma passing through the plasma electrode 100. The gas is introduced into the plasma electrode 100 through the central opening 103 in the electrode head 102, as is indicated schematically by the arrow 108, and, within the plasma electrode 100 that is illustrated in FIG. 1, passes through a large number of openings in the third gas-permeable film element as an ionized gas, that is to say as a plasma, out of the plasma electrode 100, as is illustrated by a number of arrows 109.

The described design of the plasma electrode 100 ensures that the gas/plasma is distributed uniformly over a large area, that is to say over the entire area of the gas-permeable film 104 which forms one electrode surface. Particularly if the spheres in the gas-permeable film 104 are composed of aluminum, the electrode surface is anodized, thus making the electrode surface harder and less sensitive to external influences.

A gas-permeable film of a plasma electrode according to the invention may, for example, have five gas-permeable film elements and may be produced by means of the method described in the following text.

A first film element composed of two or more layers of electrically conductive spheres with a diameter of 10 mm is arranged on the base of the electrode head in an electrode head 102 composed of aluminum or graphite. A second film element composed of two or more layers of electrically conductive spheres with a sphere diameter of 7 mm is arranged on the first film element. A third film element composed of two or more layers of electrically conductive spheres with a sphere diameter of 4 mm is arranged on the second film element. A fourth film element composed of two or more layers of electrically conductive spheres with a sphere diameter of 2 mm is arranged on the third film element. A fifth film element composed of two or more layers of electrically conductive spheres with a sphere diameter of 1 mm is arranged on the fourth film element. The material of the spheres in all of the film elements is in this case the same material as that of the electrode head 102, that is to say aluminum or graphite. In order to improve the homogeneity of the sphere packing within the individual film elements, gas-permeable intermediate bases may be arranged between one or more film elements.

The electrode head 102 together with the film elements composed of spheres is then heated and/or is subjected to pressure, so that the individual spheres are sintered to one another, resulting in a porous gas-permeable body, that is to say the gas-permeable film 104. Furthermore, at the same time, the porous body is sintered to the electrode head 102, thus resulting in a firm connection between these two elements which not only provides good mechanical robustness, but also ensures good electrical conductivity and thermal conductivity.

One aspect of the invention may be seen in that a conductive pot (electrode head 102 in the form of a pot) with a central hole 103 is clearly filled from the base with granulate, which is then sintered.

It should also be noted that the gas-permeable film 104 of the plasma electrode 100 preferably ends flush with the base area of the electrode head 102 since, in this case, the electrically conductive spheres can easily be sintered. The electrode is thus clearly filled with granulate as far as the pot base.

Alternatively, during the filling of the electrode head 102, an intermediate space which has not been filled may also remain between the granulate and/or the first gas-permeable film element 105 and the base area of the electrode head 102.

A further characteristic of the plasma electrode 100 is that, as a result of the use of electrically conductive spheres, the pores in the individual gas-permeable film elements 105, 106 and 107 have a standard size. The pore size in one gas-permeable film element is thus clearly defined, and is therefore, for example, not distributed randomly about a mean pore size.

Furthermore, the porous structure that is formed in the plasma electrode 100 and is formed from the gas-permeable film elements 105, 106 and 107 has a defined density gradient, which allows optimum gas distribution.

It should be noted that the porous structure has the same electrical conductivity as the electrode surface. Furthermore, the porous structure has the same thermal conductivity as the electrode surface. The porous structure furthermore has the same thermal coefficients of expansion as the electrode surface, so that it is possible to use the plasma electrode without any problems at a temperature of several hundred degrees. In addition, the porous structure has the same chemical characteristics and resistances as the electrode surface, and this is advantageous, for example, when being used with aggressive or corrosive gases.

A further characteristic of the plasma electrode 100 is that no holes are required in order to produce the electrode. The gas outlet holes through which the ionized gas or plasma emerges are formed naturally.

Figure 2:
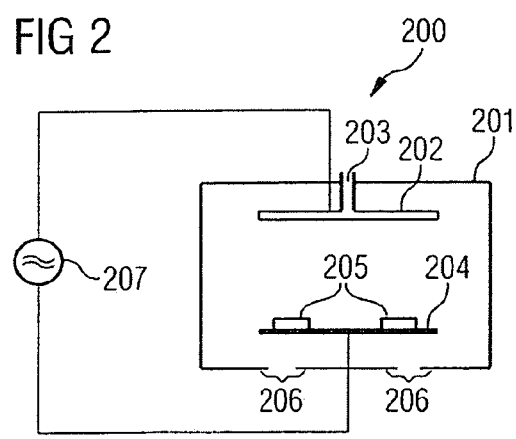
FIG. 2 shows a schematic illustration of a parallel-plate reactor with a plasma electrode according to the invention.
Figure 3:
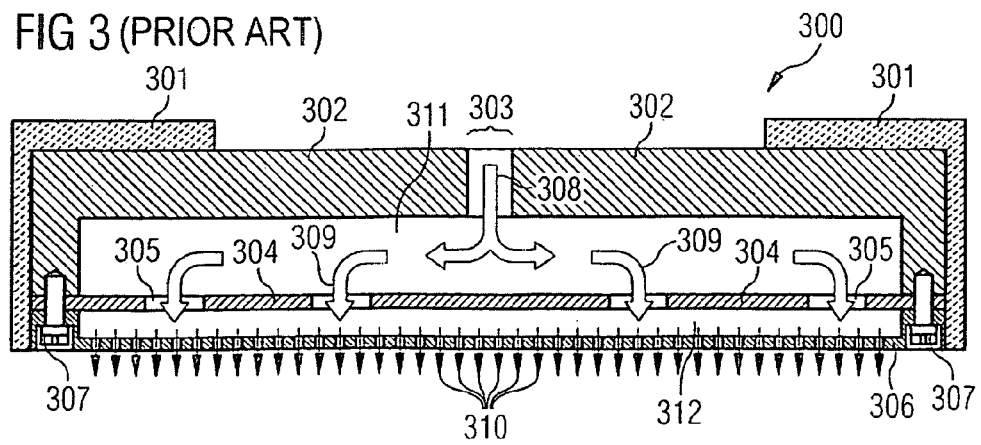
FIG. 3 shows a schematic illustration of a plasma electrode according to the prior art.

FIG. 2 shows a schematic illustration of a parallel-plate reactor in which a plasma electrode according to the invention can be used.

A parallel-plate reactor 200 has a vacuum chamber 201. A plasma electrode 202 is arranged within the vacuum chamber 201 and has a gas inlet opening 203. An opposing electrode 204 is arranged in the vacuum chamber 201 underneath the plasma electrode 202 in FIG. 2, and is referred to as a drawing electrode. Two wafers 205 are illustrated schematically on the drawing electrode 204 in FIG. 2 and are processed by means of the parallel-plate reactor 200 in a plasma etching step or a PCVD process step. The vacuum chamber 201 also has plasma outlet openings 206, through which the ionized gas, that is to say the plasma, which is introduced into the vacuum chamber 201 as a gas through the gas inlet opening 203 and the plasma electrode 202, is passed out of the vacuum chamber 201. Furthermore, the parallel-plate reactor 200 has a radio-frequency generator 207, which is on the one hand coupled to the plasma electrode 202, and is on the other hand coupled to the drawing electrode 204.

In summary, one aspect of the invention can be seen in that a plasma electrode, a method for production of the plasma electrode and a parallel-plate reactor are created, in which the buffer plate and the shower plate of a plasma electrode according to the prior art are replaced by a porous gas-permeable body. The porous gas-permeable body is preferably formed by introducing single-layer or multiple-layer film elements with electrically conductive spheres, composed of aluminum or graphite by way of example, into an electrically conductive container which has a central gas hole in its base and has, for example, aluminum or graphite as its material. In this case, the sphere diameter decreases from one film element to the next, starting from the base of the electrically conductive container.

The following documents are cited in this document:
[1] WO 03/001558 A1
[2] U.S. Pat. No. 6,118,218 A
[3] US 2004/0110059 A1
[4] U.S. Pat. No. 6,451,157 B1

The invention claimed is:

1. A gas-permeable plasma electrode adapted for use in a parallel plate reactor, the gas-permeable plasma electrode having:
    an electrically conductive container with a base which has a hole, through which gas is introduced into the gas-permeable plasma electrode; and
    a gas-permeable porous electrically conductive film,
    with the gas-permeable porous electrically conductive film being arranged opposite the base in the electrically conductive container and being connected to the electrically conductive container in such a manner that the gas-permeable porous electrically conductive film ends flush with the base of the electrically conductive container, and
    with the gas-permeable porous electrically conductive film having a layer sequence of two or more gas-permeable film elements each having at least one layer of electrically conductive grains, at least some of which are arranged so as to form a gas-permeable film,
    wherein the electrically conductive grains in each gas-permeable film element have a different diameter, and
    wherein the diameters of the electrically conductive grains in the individual gas-permeable film elements decrease from the base of the electrically conductive container.

2. The gas-permeable plasma electrode as claimed in claim 1, in which the electrically conductive grains are sintered to one another.

3. The gas-permeable plasma electrode as claimed in claim 1, in which the electrically conductive grains are essentially spherical.

4. The gas-permeable plasma electrode as claimed in claim 1, in which each gas-permeable film element has two or more layers of electrically conductive grains.

5. The gas-permeable plasma electrode as claimed in claim 1, in which the electrically conductive grains in the gas-permeable film have graphite and/or aluminum.

6. The gas-permeable plasma electrode as claimed in claim 1, in which one surface of the gas-permeable porous electrically conductive film, which faces away from the base of the electrically conductive container, is anodized.

7. The gas-permeable plasma electrode as claimed in claim 1, in which the gas-permeable porous electrically conductive film has at least one gas-permeable intermediate base, which is arranged between two gas-permeable film elements.

8. The gas-permeable plasma electrode as claimed in claim 1, in which the gas-permeable porous electrically conductive film has the same electrical conductivity as the electrically conductive container.

9. The gas-permeable plasma electrode as claimed in claim 1, in which the gas-permeable porous electrically conductive film has the same thermal conductivity as the electrically conductive container.

10. The gas-permeable plasma electrode as claimed in claim 1, in which the gas-permeable porous electrically conductive film is formed from the same material as the electrically conductive container.

11. The gas-permeable plasma electrode as claimed in claim 1, in which the gas-permeable porous electrically conductive film has the same thermal coefficients of expansion as the electrically conductive container.

12. The gas-permeable plasma electrode as claimed in claim 1, in which the gas-permeable porous electrically conductive film has the same chemical characteristics and resistances as the electrically conductive container.

* * * * *